United States Patent [19]

Rice

[11] 4,387,137
[45] Jun. 7, 1983

[54] CAPACITOR MATERIAL

[75] Inventor: James M. Rice, Sepulveda, Calif.

[73] Assignee: The Mica Corporation, Culver City, Calif.

[21] Appl. No.: 211,645

[22] Filed: Dec. 1, 1980

[51] Int. Cl.³ .............................................. B32B 15/04
[52] U.S. Cl. .................................... 428/332; 156/247; 156/344; 204/13; 204/40; 204/52 R; 428/336; 428/339; 428/469; 428/931
[58] Field of Search ............... 428/469, 339, 901, 629, 428/623, 931; 156/247, 344; 204/12, 13, 40, 52 R

[56] References Cited

U.S. PATENT DOCUMENTS 3,998,601 12/1976 Yates et al. ..................... 428/339 X
4,195,124 3/1980 Doi et al. ............................ 428/469

Primary Examiner—Thomas J. Herbert, Jr.
Attorney, Agent, or Firm—Joseph E. Mueth

[57] ABSTRACT

A novel laminate adapted for use in the manufacture of capacitors comprising layers of microthin pin-hole free electroformed copper bonded together by a thin layer of hardened dielectric material, said bonded surfaces of said microthin copper having first been treated to form thereon a superficial coating of cupric oxide, bonded to the outer surfaces of said microthin copper, layers of self-sustaining copper foil, the bonded surfaces of said copper foil having been passivated under reducing or cathodic conditions in an aqueous solution of chromic oxide to passivate the surface thereof and to render said copper foil peelably removable from said microthin copper.

A method of forming capacitor networks which comprises establishing a laminate having layers of microthin pin-hole free electroformed copper bonded together by a thin layer of hardened dielectric material, said bonded surfaces of said microthin copper having first been treated to form thereon a superficial coating of cupric oxide, bonded to the outer surfaces of said microthin copper, layers of self-sustaining copper foil, the bonded surfaces of said copper foil having been passivated under reducing or cathodic conditions in an aqueous solution of chromic oxide to passivate the surface thereof and to render said copper foil peelably removable from said microthin copper, peeling away one of said copper foils, photoprocessing the exposed microthin copper to a desired pattern, bonding a reinforced plastic material to said pattern to form an adherent substrate in abutment thereto, removing the other copper foil, and photoprocessing the second exposed microthin copper to a desired pattern.

5 Claims, 2 Drawing Figures

CAPACITOR MATERIAL

BACKGROUND OF THE INVENTION

Various proposals have been made for the manufacture of capacitor by photoprocessing techniques.

High capacitance normally involves the use of very thin dielectric layers. Photoprocessing involves the repeated handling of the layers which can damage or interrupt thin layers. Hence, heretofore, it has not been possible to consistently obtain high quality capacitors of high capacity by photoprocessing techniques.

The product of Yates U.S. Pat. No. 3,998,601 is characterized by several problems. The microthin layer of 2 to 12 microns has been found in many cases to contain pinholes which render the laminate unsuited for its intended purpose. Yet another problem in the practice of Yates is that the microthin copper is often badly stained or marked. In contrast thereto, we have found that by adhering to a certain combination of conditions in the bath, this serious problem can quite surprisingly be solved and a reproducible commercial laminate useful in the production of capacitors can be obtained.

The present invention has solved a long-standing problem in the art and it is to be expected that this invention will be rapidly adopted by those skilled in the art.

SUMMARY OF THE INVENTION

Briefly, the present invention includes a novel laminate adapted for use in the manufacture of capacitors comprising layers of microthin pin-hole free electroformed copper bonded together by a thin layer of hardened dielectric material, said bonded surfaces of said microthin copper having first been treated to form thereon a superficial coating of cupric oxide, bonded to the outer surfaces of said microthin copper, layers of self-sustaining copper foil, the bonded surfaces of said copper foil having been passivated under reducing or cathodic conditions with an aqueous solution of chromic oxide to passivate the surface thereof and to render said copper foil peelably removable from said microthin copper.

The invention also includes a method for forming capacitor networks which comprises establishing a laminate having layers of microthin pin-hole free electroformed copper bonded together by a thin layer of hardened dielectric material, said bonded surfaces of said microthin copper having first been treated to form thereon a superficial coating of cupric oxide, bonded to the outer surfaces of said microthin copper, layers of self-sustaining copper foil, the bonded surfaces of said copper foil having been passivated under reducing or cathodic conditions with an aqueous solution of chromic oxide to passivate the surface thereof and to render said copper foil peelably removable from said microthin copper, peeling away one of said copper foils,
photoprocessing the exposed microthin copper to a desired pattern,
bonding a reinforced plastic material to said pattern to form an adherent substrate in abutment thereto,
removing the other copper foil, and
photoprocessing the second exposed microthin copper to a desired pattern.

It is an object of this invention to provide a novel laminate.

It is an object of this invention to form a novel laminate adapted to be used to make capacitors.

It is also an object of this invention to provide a novel means and method of forming capacitors.

These and other objects and advantages of this invention will be apparent from the detailed description which follows.

DESCRIPTION OF THE PREFERRED EMBODIMENTS

According to this invention, it is possible to achieve a capacitance of 400 picofarads per square centimeter with a one-half ($\frac{1}{2}$) mil dielectric layer. A capacitance of 1000 picofarads per square centimeter is obtainable with a dielectric layer thickness of 0.1 to 0.2 mils.

This invention can be better understood by reference to the accompanying drawings in which.

Figure 1:
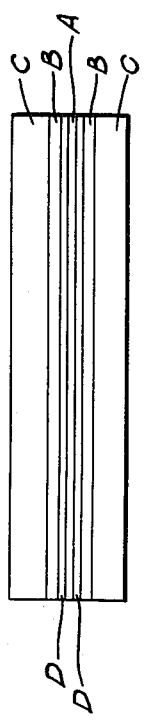
FIG. 1 is a sectional view of the novel laminate of his invention.
Figure 2:
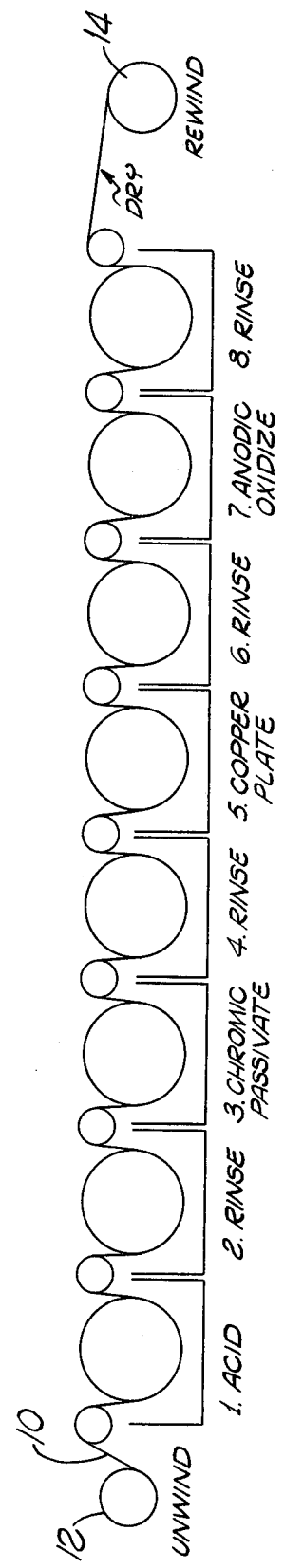
FIG. 2 is a schematic drawing which depicts the several steps or stages involved in the manufacture of the novel laminate of this invention.

Turning to FIG. 1 in more detail, the hard dielectric adhesive layer A bonds to the black copper oxide layers D previously applied to the microthin pin-hole free electroformed copper layers B. The outer layers C are the pre-formed, self-sustaining copper foil which are peelably separate from layer B by virtue of the aqueous chromium oxide passivation of the foil prior to the electrodeposit of the microthin copper. Chromium oxide is not shown in the drawing since there is no palpable deposit of chromium or any chromium salt. While not bound by any theory, it is clear that the passivation results in a surface or finish on the copper foil C which enables the layer C to be peelable from layer B.

According to this invention, the microthin copper layer B having a thickness of 25 to 100 microinches (0.625 to 2.5 microns) can be made without pin holes or staining; after layer C has been peeled away by operating under the following conditions as contrasted to Yates:

|  | Invention | Yates |
| --- | --- | --- |
| Duration | 60–90 sec. | 5 sec.–5 min. |
| Bath Temperature | 20–30° C. | Room Temp. - Boiling |
| Cathode Current Density | 0.5–1.0 amp/ft$^2$ | 1–50 amp/ft$^2$ |
| Concentration of CrO$_3$ | 8–12 gms/l | 3–50 gms/l |
| Anode | Stainless Steel | Pb or Pb/Sb alloy |

In the preferred embodiment, the process makes use of either one ounce electrodeposited copper or one mil rolled copper foil C as a carrier for the subsequently deposited thin pin-hole free copper electroformed layer B. They key to the process is the chromic passivation step which provides a thin uniform release film of unknown composition. Too thick a film results in exfoliation, premature release, and voids in the deposit; too thin results in sticking of the deposit to the carrier. The following parameters have been used in the production of 100 microinch thickness layer B (0.1 mil or 2.5 micron) on one mil copper foil, layer C. The invention is applicable to the production of thicknesses from about 25 microinches up to 100 microinches or more.

The following Example is presented solely to illustrate the invention.

EXAMPLE

A 100 pound roll of one ounce×11½ inches wide copper foil 10 is mounted at the unwind 12, drum (shiny) side down. The rewind rate is set at 1.0 foot per minute. This results in a bath immersion time of about 1.2 minutes for a 12 inch diameter immersed drum.

Tank No. 1 contains 10% by volume sulfuric acid to remove the stainproofing applied by the vendor.

Tank No.'s 2, 4, 6, and 8 contain rinse water.

Tank No. 3 contains an aqueous Electrolytic chromate passivation solution at room temperature (25° C.):
$CrO_3$ 10 gm/liter
Current 0.5–1.0 ampere per square foot
Anode: Stainless steel
Cathode: Copper foil
Duration: One Minute, Twenty seconds Tank No. 5 contains a copper plate solution (Electroform) having the following composition:
$CuSO_4$ $0.5H_2O$ 250 gm/liter
$H_2SO_4$ 40 gm/liter
Temperature: 40°–40° C.
Continuous filtration and agitation.
Current: 100 amperes
Anode-to-cathode ratio >1:1

Tank No. 7 contains a solution which produces an anodic black oxide of CuO which is shown as layer D in FIG. 1.
NaOH 120 gm/liter
Temperature: 80°–100° C.
Current: 2–10 amps
Cathode: Steel
Anode-to-cathode ratio >1:1

After a final rinse in Tank No. 8, the composite consisting of the carrier C/100 microinches copper B/cupric oxide (black) D is dried with warm air and rewound. Later the roll 14 is removed from the rewind stand and set aside for further processing.

In Tank No. 3, the copper foil is cathodic. Logically, there would form an anodic film. The result actually obtained was unexpected.

The composite material is then sheeted into suitable lengths. The blackened surface layer D is then coated with a thin layer of adhesive material. A second sheet of the composite material, cut the the same general size is then pressed with the blackened surface layer D against the adhesive material and the overall laminate is permitted to dry, with the benefit of heat if necessary.

The carrier C can be removed by peeling, leaving behind the 100 microinches layer B of copper in tact and firmly bonded to the dielectric. The carrier peel is typically 0.1–0.3 pounds per inch of width, which is sufficient to keep the carrier firmly in place during handling and subsequent fabrication, yet permits its easy removal when desired.

After removal of the carrier C, the thin layer of copper B was found to be essentially pin hole and stain free. In fact, the replication of the carrier surface is quite exact. The peel strength after plating up to an equivalent thickness of one ounce copper (1.4 mil) is typically 7–9 pounds per inch of width vs. epoxyglass. The thin copper clad laminate can be chemically processed as, for example, black oxided in a hot caustic oxidizing bath. Additionally, when etching circuits, the dwell time in the etcher is 5 to 10 seconds compared to 1–2 minutes for one ounce copper: Undercut of the copper lines is eliminated which permits high line resolution and very dense circuitry. The production of circuitry is typically as follows. A layer of photoresist (Kodak KPR) is applied to one of the exposed layers B. The photoresist is exposed through a photographic negative of the circuit pattern. The resist is developed and the unexposed portions washed away. The panel is immersed in an etchant to remove the copper in areas not covered by photoresist. Any commonly used copper etchant can be used.

The panel is rinsed in water and the remaining photoresist stripped off. The developed surface carring the desired capacitor pattern is then bonded to, for example, a number of layers of epoxy prepreg, and the epoxy cured in a heated press to form a relatively thick rigid support or insulating base. The other layer of carrier C is then peeled off and the exposed, second layer B is developed by photoprocessing, as described above. The desired capacitor circuitry pattern is thus obtained.

Tank No. 1 can contain a wetting agent such as Dowfax Al to remove any residual oil from the copper foil.

Having fully described the invention, it is intended that it be limited only by the lawful scope of the appended claims.

I claim:

1. A laminate adapted for use in the manufacture of capacitors comprising layers of microthin pin-hole and stain free electroformed copper bonded together by a thin layer of hardened dielectric material, said bonded surfaces of said microthin copper having first been treated to form thereon a superficial coating of cupric oxide, bonded to the outer surfaces of said microthin copper, layers of self-sustaining copper foil, the bonded surfaces of said copper foil having been passivated under cathodic or reducing conditions in an aqueous solution of chromic oxide to passivate the surface thereof and to render said copper foil peelably removable from said microthin copper.

2. The laminate of claim 1 wherein the laminate is rigid.

3. The laminate of claim 1 wherein the microthin copper is from about 25 to 100 microinches in thickness.

4. The laminate of claim 1 wherein the dielectric material has a thickness of from 0.1 to 0.5 mils.

5. The laminate of claim 1 wherein the laminate after removal of the copper foil has a capacitance of from 400 to 1000 picofarads per square centimeter.

* * * * *